United States Patent
Saint-Patrice et al.

(10) Patent No.: US 10,532,924 B2
(45) Date of Patent: Jan. 14, 2020

(54) PACKAGING STRUCTURE OF A MICROELECTRONIC DEVICE HAVING A HERMETICITY IMPROVED BY A DIFFUSION BARRIER LAYER

(71) Applicants: COMMISSARIAT A L'ENERGIE ATOMIQUE ET AUX ENERGIES ALTERNATIVES, Paris (FR); EPCOS AG, Munich (DE)

(72) Inventors: Damien Saint-Patrice, Chabeuil (FR); Arnoldus Den Dekker, Beuningen (NL); Marcel Giesen, Munich (DE); Gudrun Henn, Ebenhausen (DE); Jean-Louis Pornin, Crolles (FR); Bruno Reig, Moirans (FR)

(73) Assignees: COMMISSARIAT A L'ENERGIE ATOMIQUE ET AUX ENERGIES ALTERNATIVES, Paris (FR); EPCOS AG, Munich (DE)

( * ) Notice: Subject to any disclaimer, the term of this patent is extended or adjusted under 35 U.S.C. 154(b) by 0 days.

(21) Appl. No.: 15/101,825

(22) PCT Filed: Dec. 6, 2013

(86) PCT No.: PCT/IB2013/002991
§ 371 (c)(1),
(2) Date: Jun. 3, 2016

(87) PCT Pub. No.: WO2015/082953
PCT Pub. Date: Jun. 11, 2015

(65) Prior Publication Data
US 2017/0057809 A1   Mar. 2, 2017

(51) Int. Cl.
*H01L 41/053* (2006.01)
*B81B 7/00* (2006.01)
*B81C 1/00* (2006.01)

(52) U.S. Cl.
CPC ........ *B81B 7/0041* (2013.01); *B81C 1/00293* (2013.01); *B81C 2203/0145* (2013.01)

(58) Field of Classification Search
CPC ... H01L 41/053; H01L 41/0533; H01L 41/23; H01L 23/10; H01L 2924/1461;
(Continued)

(56) References Cited

U.S. PATENT DOCUMENTS 7,923,790 B1 * 4/2011 Quevy .................. B81B 7/02
257/414
2004/0183214 A1 9/2004 Partridge et al.
(Continued)

FOREIGN PATENT DOCUMENTS

EP     1 460 038 A2   9/2004
EP     1 708 958 B1   1/2008
(Continued)

OTHER PUBLICATIONS

International Search Report and Written Opinion dated Sep. 5, 2014 in PCT/IB2013/002991 filed Dec. 6, 2013.
(Continued)

*Primary Examiner* — Fazli Erdem
(74) *Attorney, Agent, or Firm* — Oblon, McClelland, Maier & Neustadt, L.L.P.

(57) ABSTRACT

A packaging structure including at least one hermetically sealed cavity in which at least one microelectronic device is arranged, the cavity being formed between a substrate and at least one cap layer through which several release holes are formed. Several separated portions of metallic material are provided such that each of the separated portions of metallic material is arranged on the cap layer above and around one of the release holes and forms an individual and hermetical plug of said one of the release holes. At least one diffusion barrier layer including at least one non-metallic material is (Continued)

arranged on the cap layer and forms a diffusion barrier against an atmosphere outside the cavity at least around the release holes. Parts of the diffusion barrier layer are not covered by the portions of metallic material.

9 Claims, 3 Drawing Sheets

(58) Field of Classification Search
CPC .... H01L 41/09; H01L 41/113; H01L 41/1132; H01L 41/1136; H01L 51/107; B81C 2203/0145; B81C 2203/0109; B81C 2203/0172; B81C 2203/019
USPC .......................................................... 257/415
See application file for complete search history.

(56) References Cited

U.S. PATENT DOCUMENTS

| | | |
|---|---|---|
| 2006/0144142 A1 | 7/2006 | Gogoi |
| 2009/0050988 A1* | 2/2009 | Suzuki ............... B81C 1/00269 257/415 |
| 2009/0075415 A1* | 3/2009 | Nakamura .......... B81C 1/00333 438/51 |
| 2009/0309175 A1 | 12/2009 | Partridge et al. |
| 2011/0189844 A1 | 8/2011 | Pornin et al. |
| 2011/0298065 A1 | 12/2011 | Partridge et al. |
| 2014/0008738 A1* | 1/2014 | Morris, III ............ B81B 7/0041 257/415 |

FOREIGN PATENT DOCUMENTS

| | | |
|---|---|---|
| EP | 2 354 083 A1 | 8/2011 |
| JP | 2007-222957 A | 9/2007 |
| JP | 2010-34547 A | 2/2010 |
| JP | 2012-148402 A | 8/2012 |

OTHER PUBLICATIONS

Japanese Office Action dated Jun. 27, 2017 in Japanese Patent Application No. 2018-638819.

Office Action dated Feb. 20, 2018 in corresponding European Patent Application No. 13 852 337.8 (with English Translation), citing documents AA and AO therein, 6 pages.

* cited by examiner

PACKAGING STRUCTURE OF A MICROELECTRONIC DEVICE HAVING A HERMETICITY IMPROVED BY A DIFFUSION BARRIER LAYER

TECHNICAL FIELD AND PRIOR ART

The invention relates to a packaging structure of at least one microelectronic device in a cavity comprising a cap provided with a diffusion barrier layer improving the hermeticity, or tightness, of the sealing of the microelectronic device in the cavity. The invention also concerns a packaging method to obtain this packaging structure. Advantageously, the invention is carried out for packaging one or several microelectronic devices like MEMS and/or MOEMS and/or NEMS and/or NOEMS devices, or any other device such that an acoustic-type or a sensor-type device, in one or several cavities and with a controlled atmosphere.

Packaging specifications depend on the type of the microelectronic device to be encapsulated and its application. Generally, the packaging should allow movement of the device and should protect the device from damage of its moving parts mainly during back-end processes such as die sawing or injection moulding. Another function of the packaging is to manage the atmosphere (pressure and gas) inside of the cavity over lifetime of the device to guarantee the performance of the device.

A wide variety of microelectronic devices have to be hermetically packaged to maintain a specific atmosphere around the devices in order to secure a reliable operation of the devices and/or an operation of the devices within specifications. For instance, MEMS-type accelerometers and gyroscopes need a low pressure (for instance, between 10 and $10^{-3}$ mbar) inside the cavities in which these devices are encapsulated.

However, MEMS-type RF switches need to work at a higher pressure to provide sufficient damping effect. For instance, such RF switch generally needs to work at a pressure higher than around 100 mbar to generate sufficient damping force in order to minimize ringing effects when such device is in an open state and/or to generate a squeeze-film damping force when such switch closes in order to minimize the force of the impact of the closure. The nature of gas or gases of the atmosphere in which such device is encapsulated is controlled primary to ensure the reliability of the device. In case of MEMS-type RF switch, the cavity atmosphere has to be free of organic solvents and moisture to, for instance, avoid degradation of the Ohmic contact by frictional polymerization, or to avoid fast charging of the dielectric of the device in case of electrostatic actuation. In general, inert gasses are the most suitable for such application.

Two different technologies are known for making such packaging. A first well known technology named cap report consists of creating a cavity by micromachining in a cap wafer, for example, silicon-based, reporting it above a support wafer on which the device is arranged and finally performing a bonding process between the cap wafer and the support wafer. This bonding step can be performed with a controlled atmosphere (control of the pressure and of the nature of gas or gases of the atmosphere) in order to obtain said controlled atmosphere in the closed cavity in which the microelectronic device is encapsulated, but the high temperature (for instance, a glass frit bonding is carried out at a temperature higher than 300° C. or higher than 350° C.) of this process and the large silicon area required for bonding the two wafers are important drawbacks (some microelectronic devices are not compatible with such high temperature).

Thin Film Packaging (also named TFP, or Thin Film Capping) is another technology which enables to decrease package height, area, thermal budget and cost compared to a cap report packaging. During a TFP process, a cap is made by depositing one or several thin layers above a sacrificial layer which is then etched through release holes made through the cap in order to form a cavity in which the device is encapsulated.

With this technology, the challenge is to close hermetically the release holes that are performed for the sacrificial layer release.

A polymer layer can be deposited above the cap to close the release holes. However, with such closing of the release holes, the atmosphere inside the cavity will evolve with the outside atmosphere (humidity, gas composition) and low pressure cannot be reach due to the gas permeability of the polymer.

Alternately, a PSG (phosphorous-doped silicate glass) layer can be used to close the release holes. However, a high temperature curing (i.e. 900° C.) is mandatory to reflow this PSG layer, such temperature being not compatible with some MEMS thermal budget.

Thus hermetic cavities with pressures over around 100 mbar or less than around $10^{-3}$ mbar, closed without high temperatures and with a controlled nature of gases inside the cavities could not be made with the above-mentioned closing processes.

Moreover, if the closing of the release holes involves a deposition of PVD (Physical Vapor Deposition), CVD (Chemical Vapor Deposition) or PECVD (Plasma Enhanced Chemical Vapor Deposition) type of a thin layer (thickness less than 10 μm) of mineral materials like $SiO_2$, the gases caught inside the cavity such as silane or TEOS for PECVD processes decrease the performances and/or the reliability of the obtained packaging. Moreover, the pressure with which these deposition processes can be carried out is limited, for instance, between $10^{-3}$ mbar and 100 mbar, as the hermeticity of the deposited layer is limited.

Document EP 1 708 958 B1 discloses a packaging method in which release holes are plugged with a plug material located in and above the holes, and an additional sealing layer, which may be metal-based, is then deposited on the cap. The use of a metallic layer as the sealing layer enables to obtain a good tightness of the cavity.

However, such metallic sealing layer can creates short circuits, for example, when electrically conductive portions, like electrical contacts, are present on the substrate. Moreover, the metallic sealing layer can also generate RF coupling with the encapsulated device.

DESCRIPTION OF THE INVENTION

One aim of the invention is to propose a new packaging structure avoiding the previously described drawbacks of the packaging structures of prior art.

The present invention thus proposes a packaging structure comprising:
- at least one hermetically sealed cavity in which at least one microelectronic device is arranged, the cavity being formed between a substrate and at least one cap layer through which at least one release hole is formed,
- at least one portion of metallic material arranged on the cap layer and hermetically plugging the release hole, at least one diffusion barrier layer comprising at least one non-metallic material, arranged on the cap layer and forming a diffusion barrier against an atmosphere outside the cavity at least around the release hole.

As metallic materials have a low permeability (for instance less than around $10^{-15}$ g/cm·s·torr), the plugging of the release hole(s) with the portion(s) of metallic material enables to hermetically close the release hole(s) and obtain a good hermeticity at the plugged release hole(s). Moreover, the diffusion barrier layer forming the diffusion barrier at least around the release hole(s) enables to avoid diffusion paths through the cap layer around the release hole(s) (these diffusion paths may be due, for instance, to an etching of a metallic layer carried out to make the portion(s) of metallic material). Thus, the use of such non-metallic diffusion barrier layer allows the plugging of the release hole(s) with portion(s) of metallic material located above and around the release hole(s) (in opposition to a metallic layer covering the whole of the cap layer) without creating diffusion paths around the release hole(s). The packaging structure according to the invention thus enables to package one or several microelectronic devices in one or several high reliability hermetic cavities.

Compared to a metallic sealing layer covering the whole of the cap layer, if the microelectronic device is sensitive to RF coupling, such RF coupling is avoided because the diffusion barrier layer is made with non-metallic material(s) and the plugging of the release hole(s) can be obtained with metallic portion(s) located above and around the release hole(s), without creating diffusion paths through the cap layer. This packaging structure is compatible with most of the microelectronic devices. Moreover, the non-metallic diffusion barrier layer also avoids short circuits with electrically conductive elements which may be arranged on the substrate, even if this diffusion barrier layer is in contact with these electrically conductive elements.

The microelectronic device may be a MEMS and/or MOEMS and/or NEMS and/or NOEMS device, and/or a microelectronic device that require long term atmosphere specification (vacuum required by a gyroscope or high pressure required by a RF switch) using the low cost TFP technology.

The expression "cap layer" has to be understood as corresponding to the layer(s) or part(s) of the layer(s) forming the cap of the cavity in which the microelectronic device is packaged.

The diffusion barrier layer may cover the whole of an outside surface of the cap layer and/or may cover side walls of the release hole and/or may cover at least a part of an inside surface of the cap layer arranged in the cavity.

The portion of metallic material may be a layer of the metallic material arranged at least on the diffusion barrier layer and above the whole of the cap layer and the release hole, or the portion of metallic material may be arranged above and around the release hole such that parts of diffusion barrier layer are not covered by the portion of metallic material. If the microelectronic device is sensitive to parasitic coupling effects, the plugging of the release hole(s) with the portion(s) of metallic material located above and around release hole(s) such that parts of diffusion barrier layer are not covered by the portion(s) of metallic material limits or avoids the parasitic coupling effects which can occurred with the microelectronic device, and thus avoids to impact significantly the performance of the microelectronic device, especially if it is a RF microelectronic device like a MEMS-type RF switch.

Parts of the diffusion barrier layer may be arranged between the portion of metallic material and the cap layer.

The non-metallic material of the diffusion barrier layer may be a ceramic material and/or an oxide material, and/or a thickness of the diffusion barrier layer may be between few nanometers and 100 nm, and preferentially between around 10 nm and 100 nm. The use of such thin diffusion barrier layer can lead to an easy etching process for the making of the release hole(s) and to a low package height.

The packaging structure may further comprise an intermediate layer covering at least a part of side walls of the release hole, and, if the diffusion barrier layer also covers the side walls of the release hole, at least a part of the intermediate layer may be arranged between the side walls of the release hole and the diffusion barrier layer. By covering at least a part of the side walls of the release hole(s), such intermediate layer can thus reduce initial dimensions of the release hole(s) and allow the deposition of the diffusion barrier layer above the release hole(s) having reduced dimensions.

The invention also concerns a method for packaging at least one microelectronic device in at least one hermetically sealed cavity, comprising at least the following steps:
  making said cavity between a substrate and at least one cap layer such that a sacrificial material and the microelectronic device are arranged in the cavity and between the substrate and the cap layer,
  etching the sacrificial material through at least one release hole made through the cap layer,
  making at least one diffusion barrier layer on the cap layer, comprising at least one non-metallic material and forming a diffusion barrier against an atmosphere outside the cavity at least around the release hole,
  making at least one portion of metallic material on the cap layer and hermetically plugging the release hole.

The diffusion barrier layer may be deposited on the whole of an outside surface of the cap layer and/or on side walls of the release hole and/or on at least a part of an inside surface of the cap layer arranged in the cavity.

The making of the portion of metallic material may comprise a deposition of a layer of the metallic material at least on the diffusion barrier layer and above the whole of the cap layer and the release hole.

The method may further comprise, after the deposition of the layer of the metallic material, an etching of the layer of the metallic material such that at least one remaining portion of the layer of the metallic material corresponds to the portion of metallic material which is arranged above and around the release hole such that parts of diffusion barrier layer are not covered by the portion of metallic material. The diffusion barrier layer may be used as an etch stop layer during the etching of the layer of the metallic material.

The etching of the layer of metallic material may be carried out by using the diffusion barrier layer as an etch stop layer.

The method may further comprise, between the etching of the sacrificial material and the making of the diffusion barrier layer, a deposition of an intermediate layer covering at least a part of side walls of the release hole, and, if the diffusion barrier layer is also deposited on the side walls of the release hole, at least a part of the intermediate layer may be arranged between the side walls of the release hole and the diffusion barrier layer.

The packaging method may be advantageously carried out at wafer level in order to hermetically seal several microelectronic devices in several cavities, advantageously in a controlled atmosphere.

The step of making the portion of metallic material may be carried out with a controlled atmosphere. The controlled atmosphere corresponds to an atmosphere with a specific pressure and a specific gas composition. Said pressure and gas composition may be chosen according to the specifications required for encapsulation, or packaging, of the microelectronic device.

BRIEF DESCRIPTION OF THE DRAWINGS

This invention will be easier to understand in view of the examples of embodiments provided purely for indicative and non-limiting purposes, in reference to the appended drawings wherein.

Identical, similar or equivalent parts of the different figures described below have the same numeric references for the sake of clarity between figures.

The different parts shown in the figures are not necessarily shown according to a uniform scale, so as to make the figures more legible.

The different possibilities (alternatives and embodiments) must be understood as being not mutually exclusive and can be combined with one another.

DETAILED DESCRIPTION OF PARTICULAR EMBODIMENTS

Figure 1:
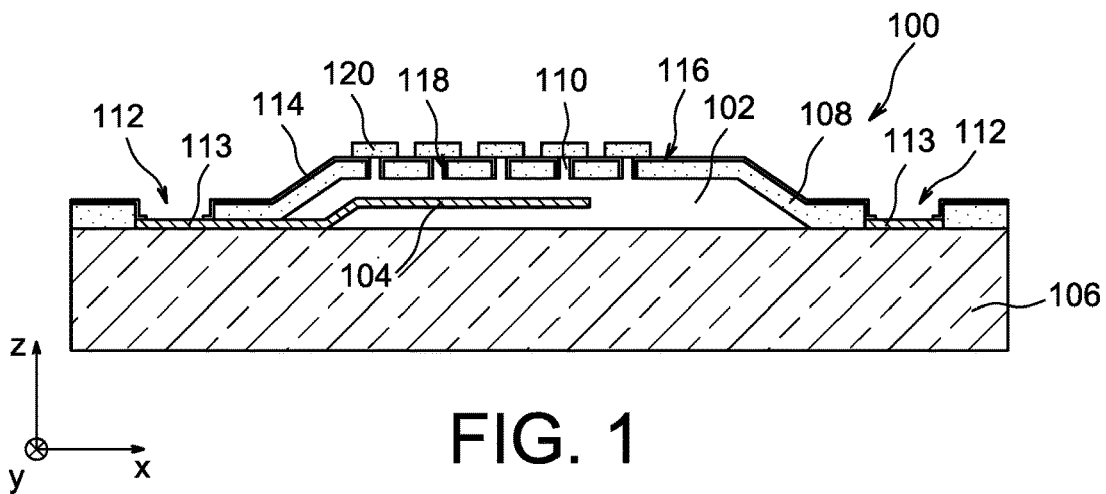
FIGS. 1 to 3 represent cross-sectional side views of packaging structures, objects of the invention, according to a first, a second and a third embodiments.

Reference is made to FIG. 1 which represents a cross-sectional side view of a packaging structure 100 according to a first embodiment.

The packaging structure 100 comprises a hermetically sealed cavity 102 in which a microelectronic device 104 is packaged. The microelectronic device 104 is here, for instance, a MEMS-type RF switch. The cavity 102 is formed between a substrate 106, or wafer, and a cap layer 108 made on the substrate 106 and forming the cap of the cavity 102. The substrate 106 is here semiconductor-based, e.g., comprising silicon. The cap layer 108 corresponds to a single layer or a stack of several layers, e.g., thin layer(s) having a thickness between around 1 µm and 10 µm. In this first embodiment, the cap layer 108 is $SiO_2$-based or SiN-based. Several release holes 110 are made through the cap layer 108, and more precisely through the part of the cap layer 108 forming an upper wall of the cavity 102. Typically, each release hole has dimensions, in a plane parallel to this part of the cap layer 108 (parallel to the plane (X,Y) shown in FIG. 1) between around 1 µm and 5 µm. The release holes 110 are used to etch a sacrificial material previously made on the substrate 106 and on which the cap layer 108 has been deposited. Apertures 112 are also made trough the layer forming the cap layer 108, in order to form accesses to elements arranged on the substrate 106. In FIG. 1, these apertures 112 form accesses to electrical contacts 113 of the microelectronic device 104 arranged outside the cavity 102.

A diffusion barrier layer 114 is arranged on the whole of an outside surface 116 of the cap layer 108. This diffusion barrier layer 114 is also arranged against side walls 118 of the release holes 110. The diffusion barrier layer 114 is made of one or several non-metallic materials with low permeability, for instance, less than around $10^{-15}$ g/cm·s·torr, preferentially a ceramic and/or oxide material like $Al_2O_3$, $ZrO_2$ or $HfO_2$. The diffusion barrier layer 114 is etched at the apertures 112 such that the electrical contacts 113 can be electrically contacted through these apertures 112. As the diffusion barrier layer 114 comprises one or several non-metallic materials, parts of the diffusion barrier layer 114 may be in contact with the electrical contacts 113 without creating short circuit. The thickness of the diffusion barrier layer 114 is comprised between 10 nm and 100 nm.

Each release hole 110 is plugged with a portion of metallic material 120 arranged on the diffusion barrier layer 114, and above and around the release hole 110.

As shown in FIG. 1, the portions of metallic material 120 are in contact with the diffusion barrier layer 114. The portions of metal material 120 here correspond to remaining portions of a metallic layer previously etched, for example Al-based, having a thickness (dimension parallel to the axis Z) between about 1 µm and 3 µm and dimensions, in a plane parallel to the part of the cap layer 108 on which the portions 120 are made (parallel to the plane (X,Y) shown in FIG. 1) between around 5 µm and 30 µm according to the dimensions of the release holes 110. The plugging of the release holes 110 with such portions of metallic material 120 ensures extremely low gas permeability at the plugged release holes 110, leading to a high reliable atmosphere cavity 102.

Compared to a layer of metallic material formed on the whole of the outside surface 116 of the cap layer 108 in order to plug the release holes 110, the plugging of the release holes 110 with several separated portions of metallic material 120 each located above and around one release hole 110 enables to limit or avoid parasitic coupling effects, e.g., RF coupling effects, with the microelectronic device 104, and also avoids short circuit with electrically conductive elements, like electrical contacts 113, arranged on the substrate 106. Thus the presence of the portions of metallic material 120 above the microelectronic device 104 does not impact significantly the performances of the microelectronic device 104.

Moreover, compared to a packaging structure in which release holes are plugged directly with portions of metallic material without a diffusion barrier layer, the making of the packaging structure 100 which the diffusion barrier layer 114 increases the tightness of the cavity 102 thus formed. Indeed, even if the metallic material used to plug the release holes have good diffusion barrier properties (e.g. permeability $>10^{-15}$ g/cm·s·torr), the patterning of a metallic layer in order to form portions of metallic material creates diffusion paths through the cap layer, that is areas of the cap layer through which the outside atmosphere can cross and thus arriving in the cavity, if no diffusion barrier layer is present under the etched parts of the metallic layer, next to the portions of metallic material. These diffusion paths thus decrease the cavity reliability.

These diffusion paths are here avoided due to the diffusion barrier layer 114 which covers the cap layer 108 at least next to the portions of metallic material 120, and here which covers the whole of the cap layer 108.

The etching of apertures, like apertures 112, trough the layer used to form the cap layer, can also creates diffusion paths through the cap layer next to these apertures. As the diffusion barrier layer 114 also covers the cap layer 108 next to these apertures 112, diffusion paths next to the apertures 112 are also avoided.

Figure 2:
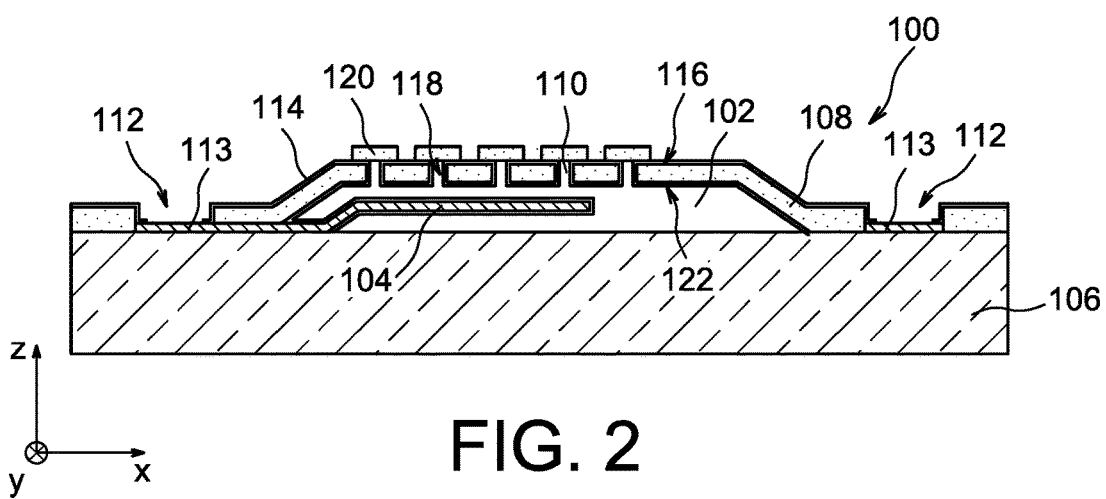

Reference is now made to FIG. 2 which represents a cross-sectional side view of the packaging structure 100 according to a second embodiment.

Compared to the packaging structure 100 previously described in relation with FIG. 1, the packaging structure 100 according to this second embodiment comprises a diffusion barrier layer 114 which is formed on the whole of the outside surface 116 of the cap layer 108 and on the sidewalls 118 of the release holes 110, but also covering the whole of an inside surface 122 of the cap layer 108, that is the surface of the cap layer 108 which is arranged inside the cavity 102. In this second embodiment, the diffusion barrier layer 114 is also formed on the surface of the microelectronic device 104 which is arranged inside the cavity 102, thus avoiding contamination (outgassing, particles, etc.) of the microelectronic device 104.

Such diffusion barrier layer 114 covering the two sides of the cap layer 108, which may be deposited with the implementation of an atomic layer deposition (ALD), is advantageously made when release holes 110 have a high aspect ratio, e.g., higher than 1 (this aspect ratio being the ratio between the width and the height of a release hole).

Figure 3:
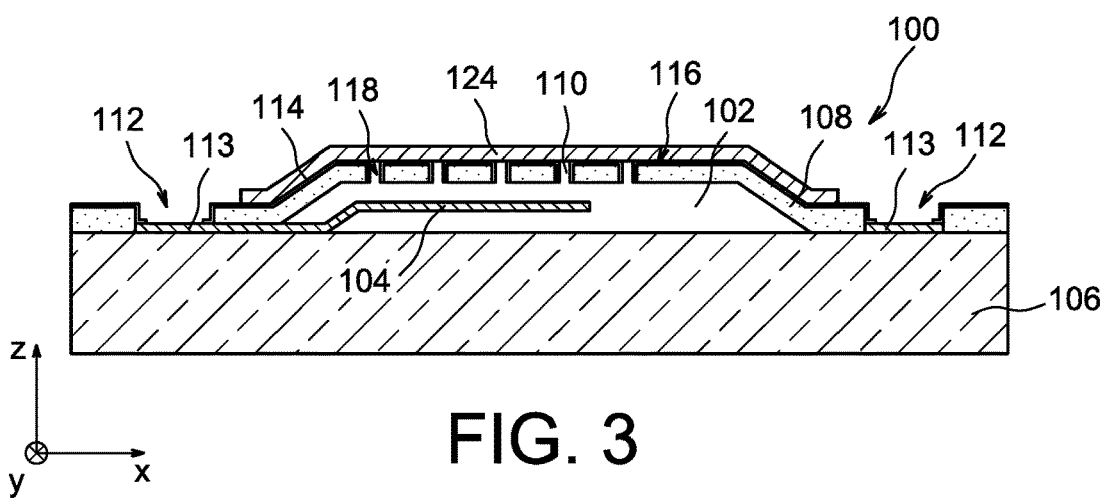

Reference is now made to FIG. 3 which represents a cross-sectional side view of the packaging structure 100 according to a third embodiment.

Compared to the packaging structure 100 previously described in relation with FIG. 1, the release holes 110 are not plugged by several portions of metallic material 120, but by a single layer of metallic material 124 plugging all the release holes 110 and covering the diffusion barrier layer 114 located on the whole of the cap layer 108. This third embodiment can be carried out when the microelectronic device 104 is not or few sensitive to the presence of metallic material, e.g., not sensitive to RF coupling with a metallic layer, arranged next to the device 104.

Reference is now made to FIGS. 4A to 4E which represent steps of a method for packaging the microelectronic device 104 in the hermetically sealed cavity 102 according to a particular embodiment. FIGS. 4A to 4E are cross-sectional side views of the packaging structure which is made with this method. The obtained packaging structure corresponds to the packaging structure 100 previously described in relation with FIG. 1.

Figure 4A:
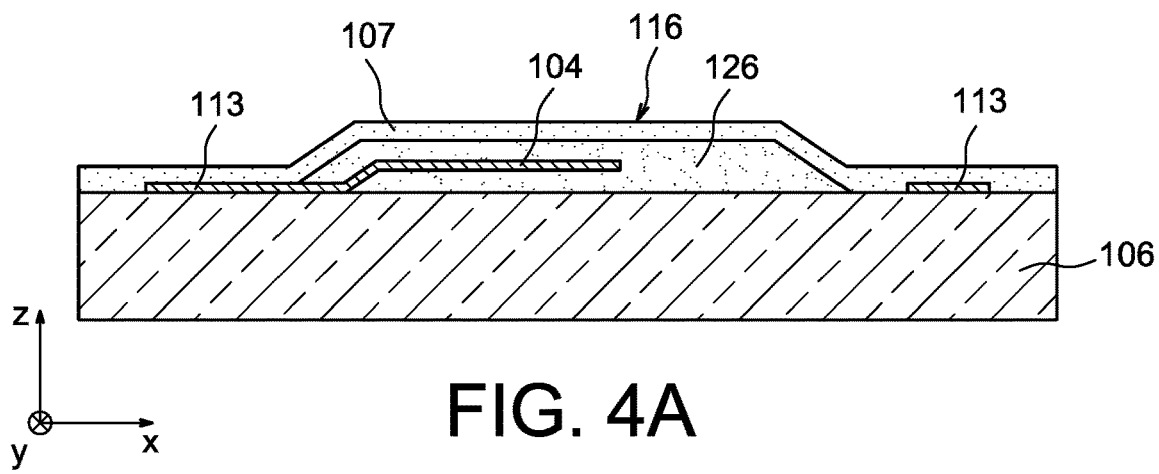
FIGS. 4A to 4E represent steps of a method for packaging at least one microelectronic device in at least one hermetically sealed cavity, object of the invention, according to a particular embodiment.

As shown in FIG. 4A, the microelectronic device 104 is first made on the substrate 106. The device 100 is then encapsulated with the implementation of a TFP process. A sacrificial material 126 is made on the substrate 106 and on the device 104.

The sacrificial material 126 is shaped such that the volume of the sacrificial material 126 corresponds to the volume of the cavity 102 in which the device 104 is intended to be encapsulated. A layer 107 which will be used to form the cap layer 108 is then deposited on the substrate 106, on the device 104 and on the sacrificial material 126. The sacrificial material 126 is chosen such that it can be selectively etched without damaging the materials of the device 104 and of the layer 107 (for instance, the sacrificial material may be Si-based when the layer 107 is SiO$_2$-based).

Figure 4B:
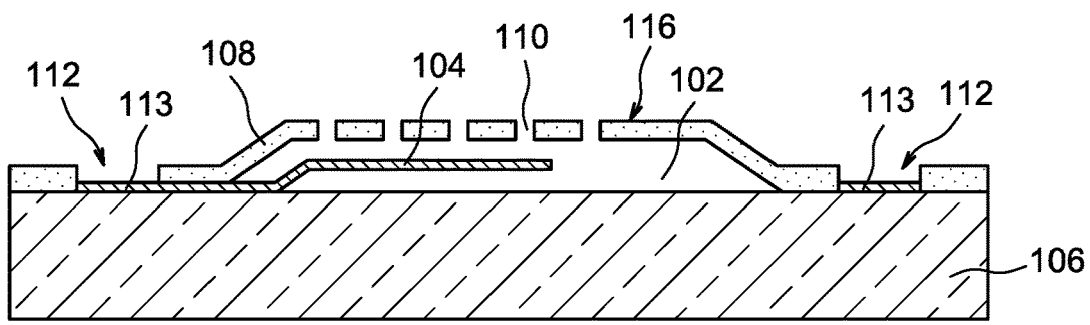

Release holes 110 are then etched through the layer 107, especially through a part of the layer 107 intended to form an upper wall of the cavity 102 in which the device 104 is intended to be encapsulated. For example, the release holes 110 are circular, that is each has a disk-shaped section in a plane parallel to the outside surface of the layer 107. The sacrificial material 126 is then etched through the release holes 110, forming the cavity 102 in which the microelectronic device 104 is arranged. The part of the layer 107 forming the cap of the cavity 102 corresponds to the cap layer 108. Other apertures 112 may be etched through the layer 107 in order to form accesses to parts (like electrical contacts) of the device 104 which are not encapsulated in the cavity 102, or to form accesses to elements arranged on the substrate 106. In FIG. 4B, two apertures 112 made through the layer 107 form electrical accesses to the electrical contacts 113 of the device 104. It is also possible that the layer 107 is etched such that only the cap layer 108 is kept on the substrate 106.

Figure 4C:
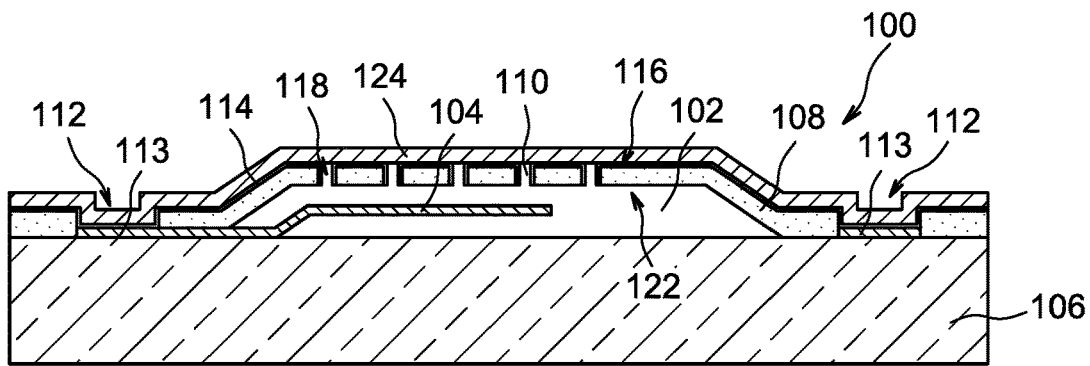

The diffusion barrier layer 114 is then deposited, for instance, by ALD, PVD, PECVD, or pulsed laser deposition, on the structure previously obtained, and especially on the whole of the outside surface 116 of the cap layer 108 and against side walls 118 of the release holes 110. ALD is advantageously carried out in the case of high conformity requirement of the diffusion barrier layer 114, and/or if the diffusion barrier layer 114 is deposited also on at least a part of the inside surface 122 of the cap layer 109 and/or on the microelectronic device 104. The diffusion barrier layer 114 is here also deposited in the apertures 112 and on remaining parts of the layer 107 which are arranged on the substrate 106 next to the apertures 112. A layer of metallic material 124 is then deposited, for instance, by PVD, on the diffusion barrier layer 114, thus plugging the release holes 110 (FIG. 4C). This step of depositing the layer of metallic material 124 is advantageously carried out under controlled atmosphere, for example, with a pressure between vacuum (typically between $10^{-4}$ and $10^{-6}$ mbar) and up to 100 mbar or more and/or with a specific gas atmosphere (typically comprising inert gas or gases like nitrogen or argon), in order to obtain this controlled atmosphere inside the cavity 102 in which the microelectronic device 104 is encapsulated.

Figure 4D:
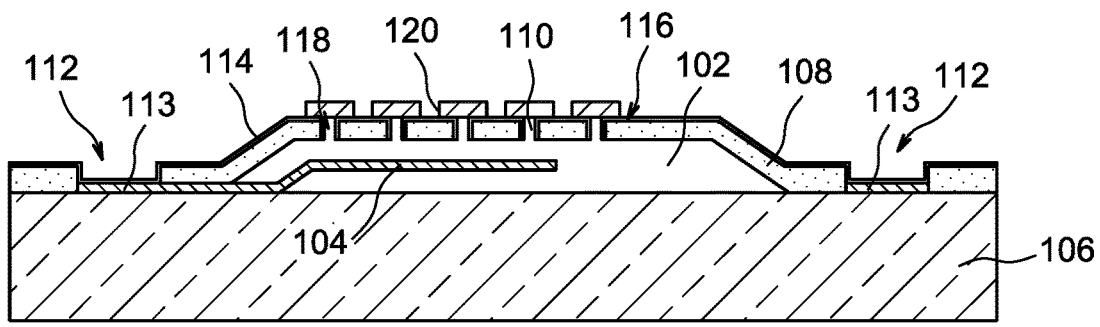

As shown on FIG. 4D, the layer of metallic material 124 is then etched such that remaining portions of metallic material 120 form individual plugs of the release holes 110. With such portions of metallic material 120, RF coupling with the microelectronic device 104 is avoided. During this etching step, the diffusion barrier layer 114 can be used as an etch stop layer. As a variant, the layer of metallic material 124 may be etched such that a remaining portion of this layer covers the whole of the cap layer 108, as previously described in relation with FIG. 3.

Figure 4E:
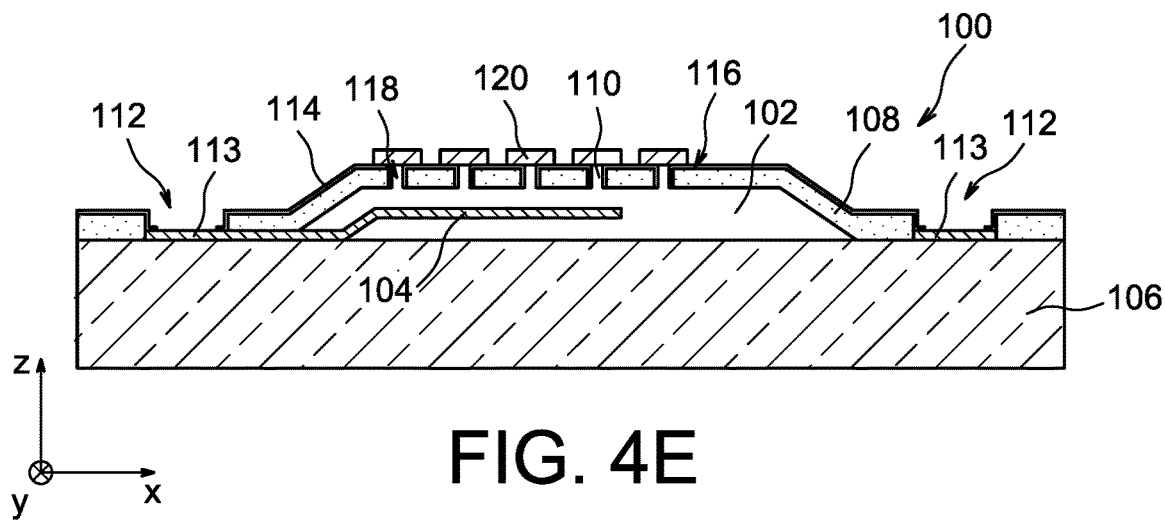

Finally, as shown in FIG. 4E, parts of the diffusion barrier layer 114 are etched, here to form accesses to the electrical contacts 113 located in the apertures 112.

The remaining portions of diffusion barrier layer 114 cover the whole cap area to avoid any diffusion from the apertures 112 and/or from the regions of the cap layer 108 next to the portions of metallic material 120.

The method above-described is advantageously carried out at wafer level, that is carried out for making several packaging structures each similar to the packaging structure 100, on the substrate 106. A cost effective packaging process is thus obtained.

Figure 5:
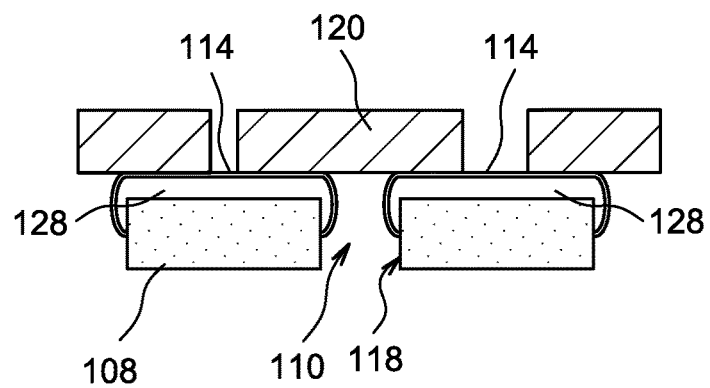
FIG. 5 represents a cross-sectional side view of a part of a packaging structure, object of the invention, according to a variant embodiment.

In all previously-described embodiments, if the dimensions of the release holes 110, in the plane of the outside surface 116 of the cap layer 108 (parallel to the plane (X,Y)), are high, for instance, above 2 μm (for instance, in order to etch the sacrificial material 126 if this portion of sacrificial material has large dimensions), it is possible to deposit an intermediate layer, called pinching layer, at least on a part of the side walls 118 of the release holes 110 in order to reduce the dimensions of the release holes 110 before the deposition of the diffusion barrier layer. For instance, if the initial dimensions of the release holes 110 are equal to around 2 μm, such intermediate layer can reduce these dimensions to around 1 µm. The diffusion barrier layer 114 is then deposited on the intermediate layer and the metallic material plugging the holes is then formed above the release holes 110 which comprise reduced dimensions compared to their initial dimensions. Such intermediate layer comprises a non-metallic material, e.g., an oxide like $SiO_2$, and has a thickness between about 1 µm and 3 µm according to the conformity of the deposited material. FIG. 5 represents one release hole 110 with such intermediate layer 128 covering a part of the side walls 118 and deposited on the cap layer 108.

Moreover, in all the embodiments, in order to reach low vacuum specification or high reliability, a getter material can be added in the cavity 102.

The invention claimed is:

1. A method for packaging at least one microelectronic device in at least one hermetically sealed cavity, comprising:
    making said at least one cavity between a substrate and at least one cap layer such that a sacrificial material and the microelectronic device are arranged in the at least one cavity and between the substrate and the at least one cap layer,
    etching the sacrificial material through several release holes made through the at least one cap layer,
    making at least one diffusion barrier layer on the at least one cap layer, comprising at least one non-metallic material and forming a diffusion barrier preventing an atmosphere outside the at least one cavity from crossing into the at least one cavity through the release holes,
    after making the at least one diffusion barrier layer, making several separated portions of metallic material such that each one is arranged on the at least one cap layer above and around one of the release holes and forms an individual and hermetical plug of said one of the release holes, wherein
    the at least one diffusion barrier layer is arranged between the at least one cap layer and the separated portions of metallic material and parts of the at least one diffusion barrier layer are not covered by the portions of metallic material, and
    the method further comprising, between the etching of the sacrificial material and the making of the at least one diffusion barrier layer, a deposition of an intermediate layer covering at least a part of side walls of the release holes.

2. The method according to claim 1, wherein the at least one diffusion barrier layer is deposited on at least one of the following elements: the whole of an outside surface of the at least one cap layer, side walls of the release holes, and at least a part of an inside surface of the at least one cap layer arranged in the at least one cavity.

3. The method according to claim 2, wherein the making of the portions of metallic material comprises:
    a deposition of a layer of the metallic material at least on the at least one diffusion barrier layer and above the whole of the at least one cap layer and the release holes, and
    an etching of the layer of the metallic material such that remaining portions of the layer of the metallic material correspond to the portions of metallic material.

4. The method according to claim 3, wherein the etching of the layer of metallic material is carried out by using the at least one diffusion barrier layer as an etch stop layer.

5. A method for packaging at least one microelectronic device in at least one hermetically sealed cavity, comprising:
    making said at least one cavity between a substrate and at least one cap layer such that a sacrificial material and the microelectronic device are arranged in the at least one cavity and between the substrate and the at least one cap layer,
    etching the sacrificial material through several release holes made through the at least one cap layer,
    making at least one diffusion barrier layer on the at least one cap layer, comprising at least one non-metallic material and forming a diffusion barrier preventing an atmosphere outside the at least one cavity from crossing into the at least one cavity through the release holes,
    after making the at least one diffusion barrier layer, making several separated portions of metallic material such that each one is arranged on the at least one cap layer above and around one of the release holes and forms an individual and hermetical plug of said one of the release holes, wherein
    the at least one diffusion barrier layer is arranged between the at least one cap layer and the separated portions of metallic material and parts of the at least one diffusion barrier layer are not covered by the portions of metallic material,
    the at least one diffusion barrier layer is deposited on at least one of the following elements: the whole of an outside surface of the at least one cap layer, side walls of the release holes, and at least a part of an inside surface of the at least one cap layer arranged in the at least one cavity, and
    the method further comprising, between the etching of the sacrificial material and the making of the at least one diffusion barrier layer, a deposition of an intermediate layer covering at least a part of the side walls of the release holes, wherein
    the at least one diffusion barrier layer is deposited on the side walls of the release holes, and
    at least a part of the intermediate layer is arranged between the side walls of the release holes and the at least one diffusion barrier layer.

6. The method according to claim 1, wherein the parts of the at least one diffusion barrier layer that are not covered by the portions of metallic material are disposed on portions of the at least one cap layer between adjacent release holes.

7. The method according to claim 5, wherein the making of the portions of metallic material comprises:
    a deposition of a layer of the metallic material at least on the at least one diffusion barrier layer and above the whole of the at least one cap layer and the release holes, and
    an etching of the layer of the metallic material such that remaining portions of the layer of the metallic material correspond to the portions of metallic material.

8. The method according to claim 7, wherein the etching of the layer of metallic material is carried out by using the at least one diffusion barrier layer as an etch stop layer.

9. The method according to claim 5, wherein the parts of the at least one diffusion barrier layer that are not covered by the portions of metallic material are disposed on portions of the at least one cap layer between adjacent release holes.

* * * * *